US011874328B2

(12) United States Patent
Leonard (10) Patent No.: US 11,874,328 B2
(45) Date of Patent: Jan. 16, 2024

(54) DETECTING BATTERY CHANGEOUT (71) Applicant: BTECH Inc., Rockaway, NJ (US)

(72) Inventor: Timothy Joseph Leonard, East Greenwich, RI (US)

(73) Assignee: BTECH Inc., Rockaway, NJ (US)

( * ) Notice: Subject to any disclaimer, the term of this patent is extended or adjusted under 35 U.S.C. 154(b) by 328 days.

(21) Appl. No.: 17/285,999

(22) PCT Filed: Oct. 21, 2019

(86) PCT No.: PCT/US2019/057121
§ 371 (c)(1),
(2) Date: Apr. 16, 2021

(87) PCT Pub. No.: WO2020/086417
PCT Pub. Date: Apr. 30, 2020

(65) Prior Publication Data
US 2021/0341539 A1    Nov. 4, 2021

Related U.S. Application Data (60) Provisional application No. 62/748,567, filed on Oct. 22, 2018.

(51) Int. Cl.
G01R 31/367    (2019.01)
G01R 31/392    (2019.01)
(Continued)

(52) U.S. Cl.
CPC ......... *G01R 31/367* (2019.01); *G01R 31/392* (2019.01); *G06N 3/04* (2013.01); *G06N 3/08* (2013.01)

(58) Field of Classification Search
CPC ...... G01R 31/367; G01R 31/392; G06N 3/04; G06N 3/08
See application file for complete search history.

(56) References Cited

U.S. PATENT DOCUMENTS 6,526,361 B1 *  2/2003  Jones ................... G01R 31/386
                                                      702/182
10,223,403 B2    3/2019  Malhotra et al.
(Continued)

FOREIGN PATENT DOCUMENTS

CN    109598451      4/2019
JP    2014 014173 A  1/2014
(Continued)

OTHER PUBLICATIONS

Aggarwal, Neural Networks and Deep Learning, Springer International Publishing AG, Aug. 25, 2018 (Year: 2018).*
(Continued)

Primary Examiner — Raymond L Nimox
(74) Attorney, Agent, or Firm — Kintner IP, LLC; Mary Frances Ludwig (57) ABSTRACT A computer-based system for automatically detecting when a battery changeout occurs has an input device, a neural net trained to identify when said battery changeout occurs based on data from a battery monitor and an output device. The system reads in battery data points once per a data period. The system then formats multiple data points into a data vector for the neural net. The neural net then produces an output vector indicating when a battery changeout occurs. The output vector may show a detected changeout as a step change in a graph.

18 Claims, 7 Drawing Sheets (51) Int. Cl.
  *G06N 3/04*        (2023.01)
  *G06N 3/08*        (2023.01)

(56)            References Cited

U.S. PATENT DOCUMENTS

| | | | |
|---|---|---|---|
| 10,310,022 | B2 | 6/2019 | Park et al. |
| 2003/0184307 | A1* | 10/2003 | Kozlowski ............ H01M 10/48 324/427 |
| 2006/0181245 | A1 | 8/2006 | Mizuno et al. |
| 2006/0284617 | A1* | 12/2006 | Kozlowski ............ H01M 10/48 324/426 |
| 2017/0016962 | A1* | 1/2017 | Iwane .................. H01M 10/48 |
| 2017/0206464 | A1* | 7/2017 | Clayton ................ G06N 3/044 |
| 2018/0010919 | A1 | 1/2018 | Huang et al. |
| 2018/0026454 | A1* | 1/2018 | Belkacem-Boussaid .................... H02J 7/005 702/63 |
| 2018/0095140 | A1* | 4/2018 | Park ...................... G01R 31/367 |
| 2018/0143257 | A1* | 5/2018 | Garcia ................. G01R 31/382 |
| 2018/0232631 | A1* | 8/2018 | Appuswamy ....... G06F 13/4068 |
| 2020/0164763 | A1* | 5/2020 | Holme .................... B60L 58/10 |
| 2021/0392416 | A1* | 12/2021 | Meißner ............... H02J 7/0063 |

FOREIGN PATENT DOCUMENTS

| | | |
|---|---|---|
| KR | 10-1902997 B1 | 10/2018 |
| KR | 10-2019-0015991 A | 2/2019 |

OTHER PUBLICATIONS

F. Rufus, S. Lee and A. Thakker, "Health monitoring algorithms for space application batteries," 2008 International Conference on Prognostics and Health Management, Denver, CO, USA, 2008, pp. 1-8, doi: 10.1109/PHM.2008.4711430. (Year: 2008).*

J. D. Kozlowski, "Electrochemical cell prognostics using online impedance measurements and model-based data fusion techniques," 2003 IEEE Aerospace Conference Proceedings (Cat. No. 03TH8652), Big Sky, MT, USA, 2003, pp. 3257-3270, doi: 10.1109/AERO. 2003.1234169. (Year: 2003).*

C.-R. Chen, K.-H. Huang and H.-C. Teng, "The Estimation of the Capacity of Lead-Acid Storage Battery Using Artificial Neural Networks," 2006 IEEE International Conference on Systems, Man and Cybernetics, Taipei, Taiwan, 2006, pp. 1575-1579, doi: 10.1109/ ICSMC.2006.384942. (Year: 2006).*

Jason Brownlee, "How to Develop a Bidirectional LSTM For Sequence Classification in Python with Keras" dated Jun. 16, 2017 in Long Short-Term Memory Networks, last viewed Oct. 18, 2018.

Jason Brownlee, How to Develop an Encoder-Decoder Model with Attention for Sequence-to-Sequence Prediction in Keras: dated Oct. 17, 2017 in Long Short-Term Memory Networks, https://web.archive. org/web/20180129095217/machinelearningmastery.com/encoder-decoder-attention-sequence-to-sequence-prediction-keras/, last viewed Oct. 18, 2018.

Jason Brownlee, "How to Use the Keras Functional API for Deep Learning" dated Oct. 27, 2017 in Deep Learning https://web.archive. org/web/20180307110540/machinelearningmastery.com/keras-functional-api-deep-learning/, last viewed Oct. 18, 2018.

Jason Brownless, "Sequence Classifiction with LSTM Recurrent Neural Networks in Python with Keras" dated Jul. 26, 2016 in Natual Language Processing, last viewed Oct. 18, 2018.

En.Wikipedia.org, Convolutional neural netowrk, https://en.wikipedia. org/wiki/Convolutional_neural_network, last viewed Oct. 23, 2018.

En.Wikipedia.org, "Long short-term memory", https://en.wikipedia. org/wiki/Long_short-term_memory, last viewed Oct. 14, 2019.

En.Wikipedia.org, "Sigmoid function", https://en.wikipedia.org/wiki/ Sigmoid_function, last viewed Oct. 23, 2018.

"Keras: The Python Deep Learning Library" last viewed Oct. 17, 2018.

English translation of JP 2014 014173 A by Toba Hiroyuki, "Portable terminal, control method, program and recording medium", last viewed Sep. 27, 2019.

En.Wikipedia.org, "F1 score", https://en.wikipedia.org/wiki/F-score, last viewed Oct. 14, 2019.

Khumprom and Yodo, "A Data-Driven Predictive Prognostic Model for Lithium-Ion Batteries based on a Deep Learning Algorithm" in MDPI, last viewed Oct. 9, 2019.

English translation of KR 10-1902997 B1 by Oh et al., "Automatic identifiction system for anomaly operation status of ship using unsupervised learning method and method thereof", last viewed Oct. 14, 2019.

English translation of KR 10-2019-0015991 A by Basu et al., "Battery management method and system for predicting battery state", last viewed Oct. 9, 2019.

English translation of CN 109598451 A by Jian et al., "A pca and lstm neural network-based non-intrusive load identification method", last viewed Oct. 14, 2019.

En.Wikipedia.org, "Deep learning", https://en.wikipedia.org/wiki/ Deep_learning, last viewed Oct. 14, 2019.

Power Solutions, "Deka Unigy High Rate Series 31HR5000", https://www.power-solutions.com/batteries/deka/unigy_ups/deka-unigy-high-rate-series-31hr5000, last viewed Oct. 9, 2019.

East Penn Manufacturing Co., Inc; "More Power—Less Space Deka unigy High Rate Series 4DHR6500" last viewed Oct. 9, 2019.

En.Wikipedia.org, "Precision and recall", https://en.wikipedia.org/ wiki/Precision_and_recall, last viewed Oct. 14, 2019.

En.Wikipedia.org, "Recurrent neural network", https://en.wikipedia. org/wiki/Recurrent_neural_network, last viewed Oct. 14, 2019.

GNB Industrial Power, "Sprinter Specifications Top Terminal Batteries", last viewed Oct. 9, 2019.

En.Wikipedia.org, "Machine learning", https://en.wikipedia.org/ wiki/Machine_learning#Types_of_learning_algorithms, last viewed Oct. 14, 2019.

PCT International Search Report for PCT/US2019/057121 "Detecting Battery Changeout" dated Jan. 9, 2020.

PCT Written Opinion of the International Searching Authority for PCT/US2019/057121 "Detecting Battery Chargeout" dated Jan. 9, 2020.

* cited by examiner

DETECTING BATTERY CHANGEOUT

TECHNICAL FIELD

The inventions described herein are in the field of battery monitors.

BACKGROUND ART

Battery monitoring data, including impedance, voltage, internal temperature, and ambient room temperature, are commonly collected on a periodic basis, such as weekly, by a battery monitoring company. Data collection may begin when batteries are first installed. The batteries may be a string of high capacity batteries used as backup in a server farm, telecommunications hub or other computing or industrial facility. The batteries might be maintained by the manager of the facility. It is often the case that the battery monitoring company is not informed of battery changeout (i.e. replacement) by the manager of the facility. When batteries are replaced, the monitor, as well as the monitoring systems and software that monitor battery health, need to be informed of the changeout in order to update data values used to make informed monitoring decisions, such as when a battery has significantly degraded relative to its initial condition.

If battery changeouts are not correctly identified, the monitor and monitoring systems, including monitoring hardware and monitoring software, do not have the correct initial values for the physical properties of the battery, such as impedance and voltage. These initial values (i. e. the earliest recorded values for a newly installed battery) are compared against future values to determine when a battery approaches failure.

The technical problem to be solved, therefore, is to automatically identify when a battery is replaced based on monitored physical data about the battery.

DISCLOSURE OF INVENTION

The disclosure of invention is provided as a guide to understanding the invention. It does not necessarily describe the most generic embodiment of the invention or the broadest range of alternative embodiments.

Figure 1:
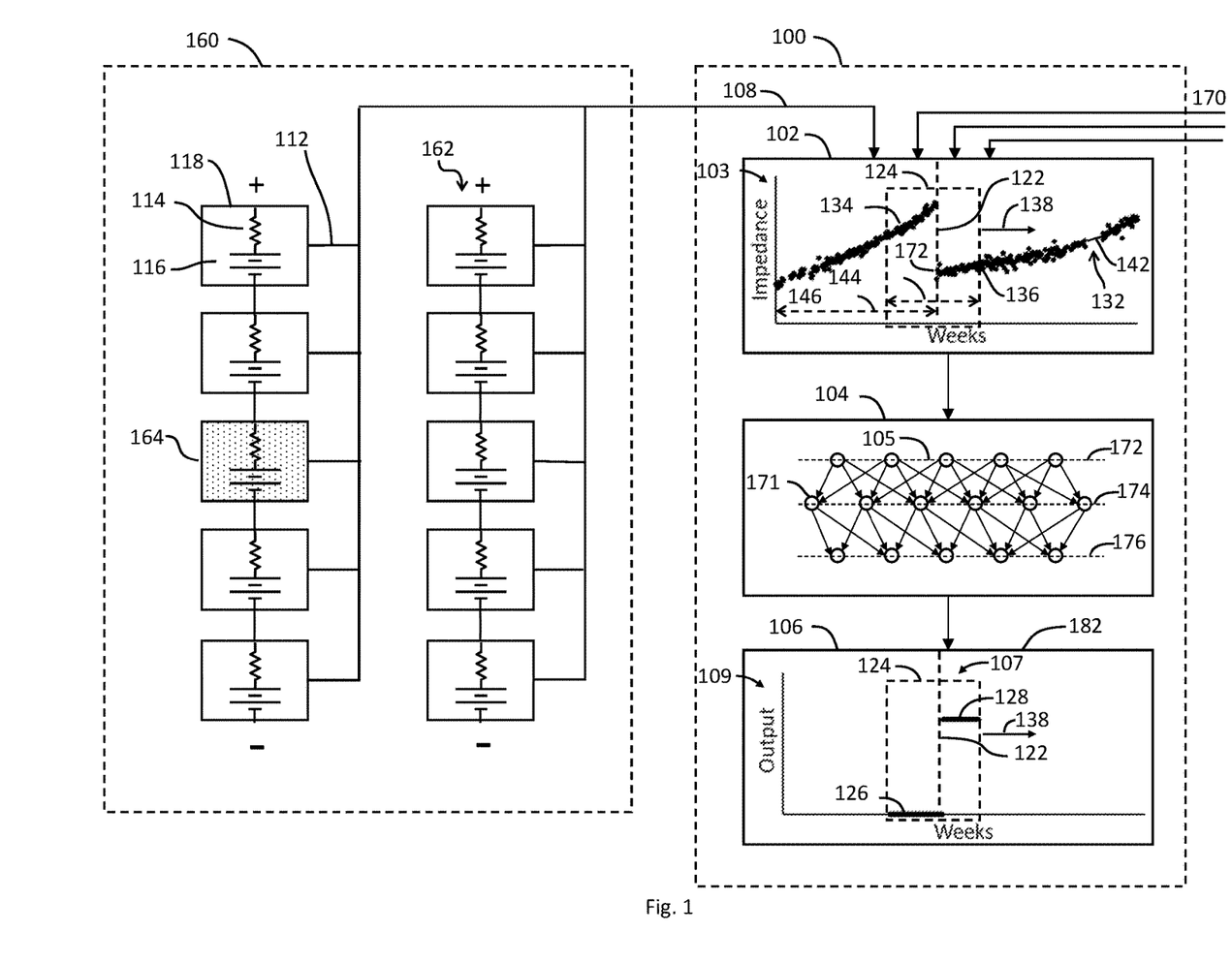
FIG. 1 is a schematic of a system to automatically determine when a battery changeout occurs.
Figure 2:
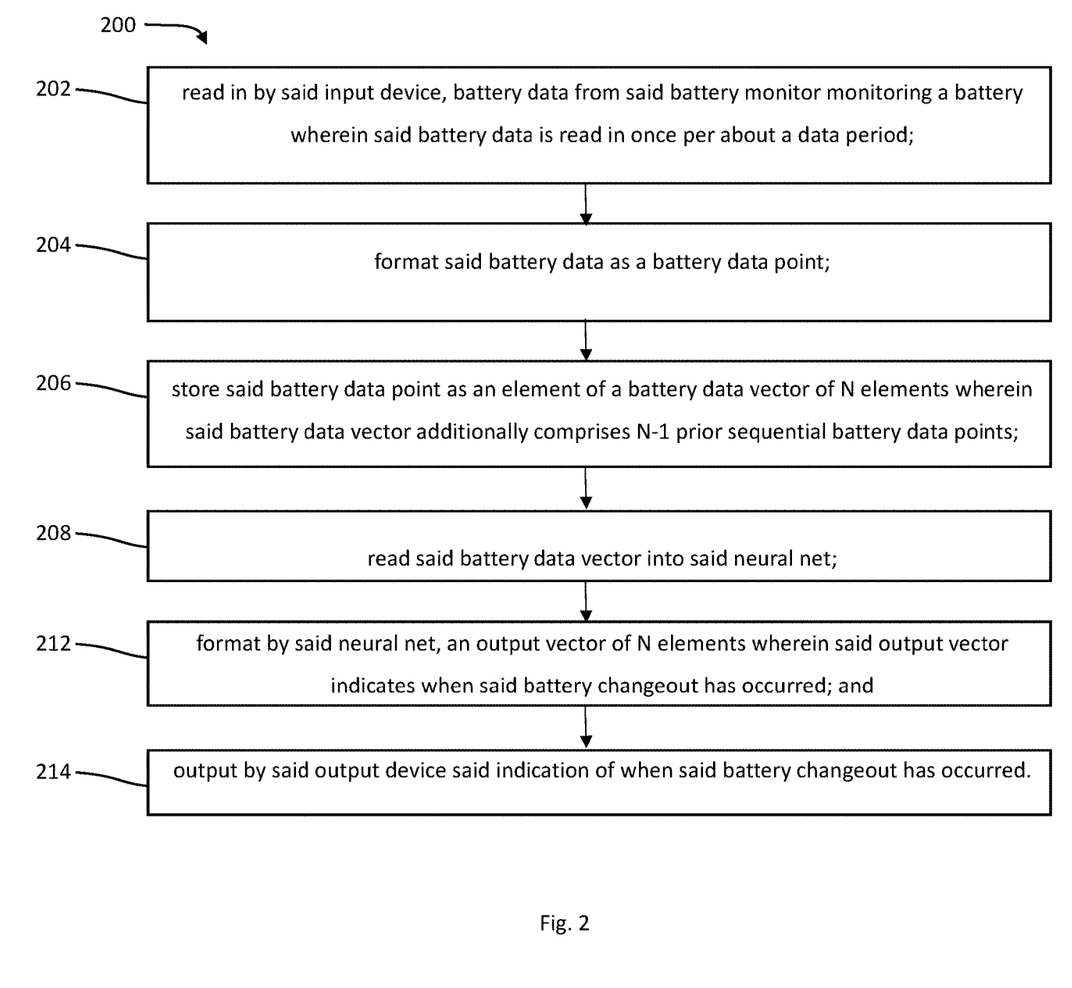
FIG. 2 is flowchart of a method for automatically determining when a battery changeout occurs.

FIG. 1 is a schematic of a system 100 to automatically determine when a battery changeout occurs. FIG. 2 is flowchart 200 of a method for automatically determining when a battery changeout occurs.

Referring collectively to FIGS. 1 and 2, a system 100 for automatically detecting when a battery changeout occurs may comprise:

a) an input device 102;
b) a neural net 105 trained to identify when said battery changeout occurs based on data from a battery monitor 112;
c) an output device 106;
d) a digital processor 104; and
e) a permanent memory comprising computer readable instructions to physically cause said digital processor to perform the steps 200:
  i) read in 108, 202 by said input device, battery data from said battery monitor monitoring a battery 118 wherein said battery data is read in once per about a data period;
  ii) format 204 said battery data as a battery data point;
  iii) store 206 said battery data point as an element of a battery data vector of N elements wherein said battery data vector additionally comprises N−1 prior sequential battery data points;
  iv) read 208 said battery data vector into said neural net;
  v) format 212 by said neural net, an output vector of N elements wherein said output vector indicates when said battery changeout has occurred; and
  vi) output 214 by said output device said indication 107 of when 122 said battery changeout has occurred.

The battery many be any type of battery located in any type of facility 160. A non-limiting example would be a 12V valve regulated lead acid (VRLA) battery located in the battery backup of an uninterruptable power supply for a server farm or a data center. Another example would be a lithium battery located in the power supply of an electric car. Another example would be a battery located in a portable electronic device. The battery may be one of a string 162 of batteries connected in series. The data monitored from the battery may be one or more of the battery voltage 116, complex or real impedance 114, battery internal temperature, battery ambient temperature or any other physical property of the battery that might be indicative of the battery health.

The system 100 may multiplex between different batteries in a string, different strings in a facility and different facilities 170 in a set of customers.

The input device 102 in FIG. 1 is shown displaying a graph 103 of exemplary battery impedance data 134 versus time (weeks). Data is read in at about once per week. Data may be read in at any suitable data period such as once per day, once per month or longer or shorter data periods.

The battery may have an expected life 146 before a changeout 122 is appropriate. Changeouts may be scheduled. A scheduled changeout usually means that all batteries in a string or facility are changed at the same time. The impedance of a battery typically rises over time until the battery is changed out. The rate of rise may vary from battery to battery. A new battery typically has a different impedance than a battery it has replaced. Thus, a step change in impedance may be an indication of a changeout. The step change may be positive or negative depending upon the impedance of the new battery versus the impedance of the old battery. Step changes in battery voltage and/or battery internal temperature minus ambient temperature may also indicate a battery changeout. Thus, a set of battery data comprising one or more of impedance, voltage, internal temperature, ambient temperature or any other physical property of a battery may be defined as a "battery data point". The battery data point may also comprise the time at which the battery data was measured.

Battery data may be measured at a particular time or may be an average or weighted average of a physical measurement of a battery property over a time period. For example, battery data may be an exponentially weighted average over a data period. Spurious data, such as due to a failure of a monitor, may be identified and removed.

There may be a gap 132 in battery data. The gap may be due, for example, to a loss of communication with a battery monitor. The steps for processing the battery data, therefore, may include the step of forecasting 142 what the battery data would be if no changeout occurred. The forecast may be performed by a separate neural net trained to forecast changes in battery data when no changeout or premature battery failure occurs. Once monitored battery data resumes, then the forecasted prior battery data can be compared to the newly incoming measured battery data to determine if a changeout has occurred during the gap in battery data.

The number of elements N in the battery data vector may be chosen to provide enough data for the neural net to make reasonably accurate determinations of whether or not a battery changeout has occurred. It was been found by experiment that when battery data is monitored on a data period of about one per week, that suitable values of N are in the range of 50 to 350.

The number N multiplied by the data period defines a duration 144 of a data window 124. The data window spans the sequential battery data points of the battery data vector. A suitable value of N is such that the duration of the data window is less than the expected life of a battery. Thus, if the expected life of a battery is 100 weeks or more, then 50 is a suitable value for N.

Battery data at the right edge 136 of the data window 124 in FIG. 1 represents current battery data. Data points to the right of the window represent future values of battery data that will be read at future times. Thus, when each new battery data point is read in, the windows shifts incrementally 138 to the right. A new battery data vector is then formatted and read into the neural net. A new output vector is then formatted by the neural net and output via the output device.

When a changeout is detected, the steps may include the step of identifying the initial impedance 172 or other physical property of the new battery. This initial value may be subsequently used to determine the future state of health of the new battery. When a battery impedance increases by more than 30% of an initial value in a short amount of time, for example, that may indicate premature failure 164 of a battery and said battery may need to be replaced before a scheduled changeout.

Neural Net

The neural net 105 illustrated in FIG. 1 is a generic representation of a neural net and not necessarily a representation of the actual neural net used in the system. Neural nets generally comprise an input layer 172 for receiving an input vector of data, one or more hidden layers 174 for processing said input vector and an output layer 176 for providing an output vector. The number of nodes 171 in each layer may be any suitable value. The number of input nodes, therefore, does not necessarily have to be the same as the number of output nodes. Thus, whereas the examples provided herein indicate that the number N of input nodes and output nodes N are the same, they could alternatively be different. For example, if the neural net is forecasting future values, then there may be more nodes in the output layer than in the input layer.

Figure 5:
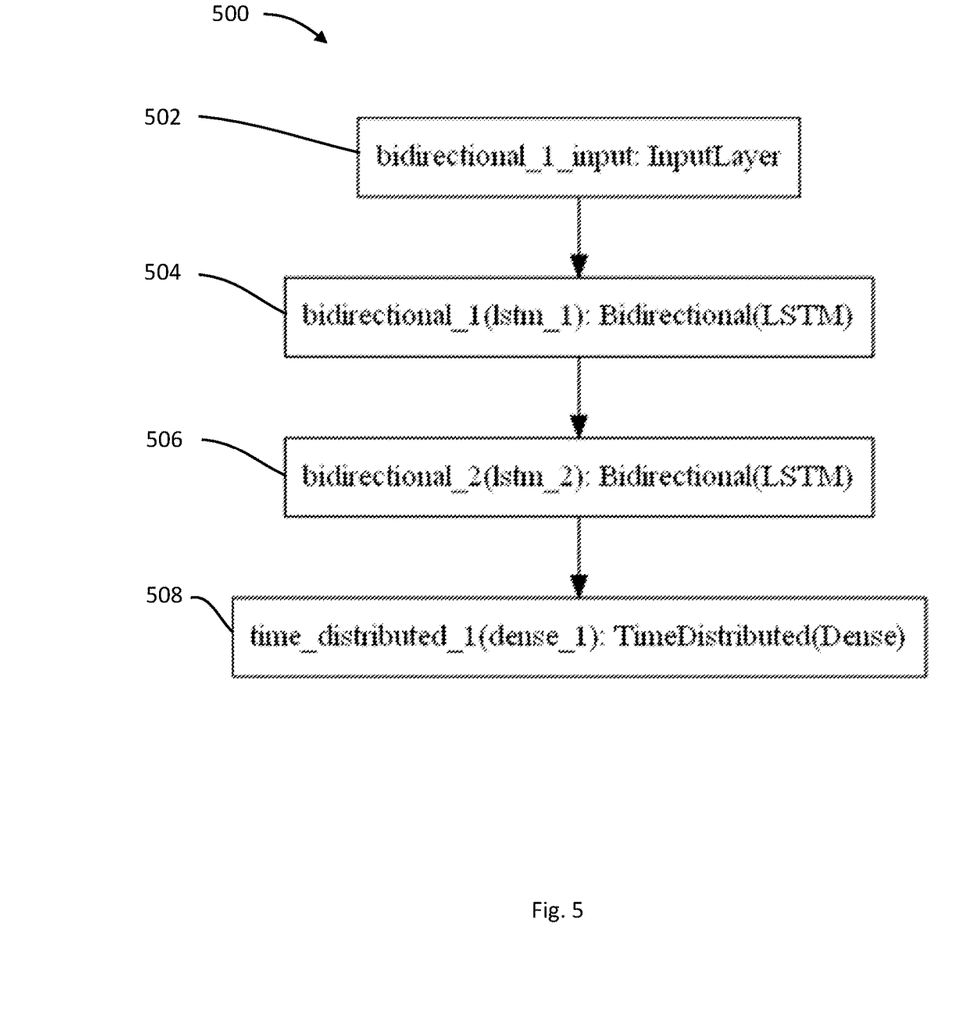
FIG. 5 is a schematic of a neural net suitable for automatically determining when a battery changeout occurs.

Referring to FIG. 5, a neural net structure 500 used for at least some of the examples provided herein, comprises a bidirectional input layer 502, a bidirectional long short-term memory (LSTM) layer 504, an additional bidirectional LSTM layer 506 and a time distributed dense layer 508. The structure is suitable for time series input data and a digital output data with binary values. Other structures may be used, such as additional time distributed hidden layers. Other types of output may be provided.

Referring back to FIG. 1, the indication 107 of a battery changeout is presented as a graph 109 of the binary values of the output vector (Output) versus time (Weeks) over the duration of the data window 124. Prior to a detected changeout 122, the output vector has been trained to have a first value 126, such as zero. After the changeout the output vector has been trained to have a second value 128, such as 1. Once the data window passes the changeout, the values of all of the elements of the output vector have been trained to be the first value. A person of ordinary skill will understand that any form of indication of a changeout is suitable, such as a simple annunciator light or sound. An advantage of the indication method presented in FIG. 1 as the graphical output of the output device is that a user may more readily detect false indications of a changeout. A false indication of a changeout, for example, might be an initial shift of a single element of the output vector to the second value which then returns to the first value at the next time step 138.

It has been found by experiment that the system 100 can reliably detect a changeout within 5 weeks (e.g. 5 data points taken on a weekly basis) of an actual changeout. This is adequate notice for the purposes of monitoring for premature failure of a battery. The changeout is indicated retrospectively in the sense that the system will accurately determine when the changeout occurred, but it needs at least 5 weeks of data to do so. Thus, if a changeout is detected 5 weeks after it occurred, then the first 5 elements of the output vector will change from the first value to the second value at the $5^{th}$ week after the changeout.

The system 100 may be a component of an overall remote battery monitoring system. Thus, the one or more battery monitors 112 in the overall remote battery monitoring system may be considered part of the system 100. Similarly, the one or more batteries 118 being monitored may be considered part of the system 100.

Communication between any elements of the system may be by any know means, such as wired or wireless communication. The computational tasks of the system may be performed by any suitable computation means, such as a CPU, vCPU, distributed, local, on-site or cloud based computational system.

Neural Net Training

As will be discussed in more detail below:
a) the neural net may have been trained by a supervised process using training data that comprises:
   i) data from a training battery monitor monitoring a training battery; and
   ii) an indication of when a training changeout occurred for said training battery;
b) said training data from said training battery may have been read at least once per about said data period;
c) said training data may comprise one or more training output vectors of N elements each occurring during a training window; and
d) when a training changeout occurs during a training window, each of said elements of said training output vector may have a first value when an element occurs before said training changeout or a second value when an element occurs on or after said training changeout.

The steps for identifying when a changeout occurs may further comprise:
a) determine when said changeout has occurred based on when said elements of said output vector from said neural net change from said first value to said second value; and
b) output by said output device said determination.

Neural Net Trained for Additional Indications

As will be discussed in more detail below, the neural net or additional neural nets may be trained to provide additional indications related to the monitored batteries. For example, the neural net may be trained by the methods described herein to distinguish between a scheduled changeout and a changeout due to a premature failure of a battery.

The neural net may be further trained to forecast when a battery is expected to fail prematurely in the future, such as, for example, when there is a sudden sharp rise in impedance. The output of the neural net, therefore, may include an indication of when a premature failure is expected to occur.

BEST MODE FOR CARRYING OUT THE INVENTION

The detailed description describes non-limiting exemplary embodiments. Any individual features may be combined with other features as required by different applications for at least the benefits described herein. As used herein, the term "about" means plus or minus 10% of a given value unless specifically indicated otherwise.

A portion of the disclosure of this patent document contains material to which a claim for copyright is made. The copyright owner has no objection to the facsimile reproduction by anyone of the patent document or the patent disclosure, as it appears in the Patent and Trademark Office patent file or records, but reserves all other copyright rights whatsoever.

As used herein, a computer-based system comprises an input device for receiving data, an output device for outputting data in tangible form (e.g. printing or displaying on a computer screen), a permanent digital memory for storing data, computer code and other digital instructions, and a digital processor for executing digital instructions wherein said digital instructions resident in said permanent memory will physically cause said digital processor to read-in data via said input device, process said data within said digital processor and output said processed data via said output device. The digital processor may comprise one or more microprocessors.

As used herein, the term "shaped" means that an item has the overall appearance of a given shape even if there are minor variations from the pure form of said given shape.

As used herein, the term "generally" when referring to a shape means that an ordinary observer will perceive that an object has said shape even if there are minor variations from said shape.

As used herein, relative orientation terms, such as "up", "down", "top", "bottom", "left", "right", "vertical", "horizontal", "distal" and "proximal" are defined with respect to an initial presentation of an object and will continue to refer to the same portion of an object even if the object is subsequently presented with an alternative orientation, unless otherwise noted.

System and Method for Training a Neural Net

Figure 3:
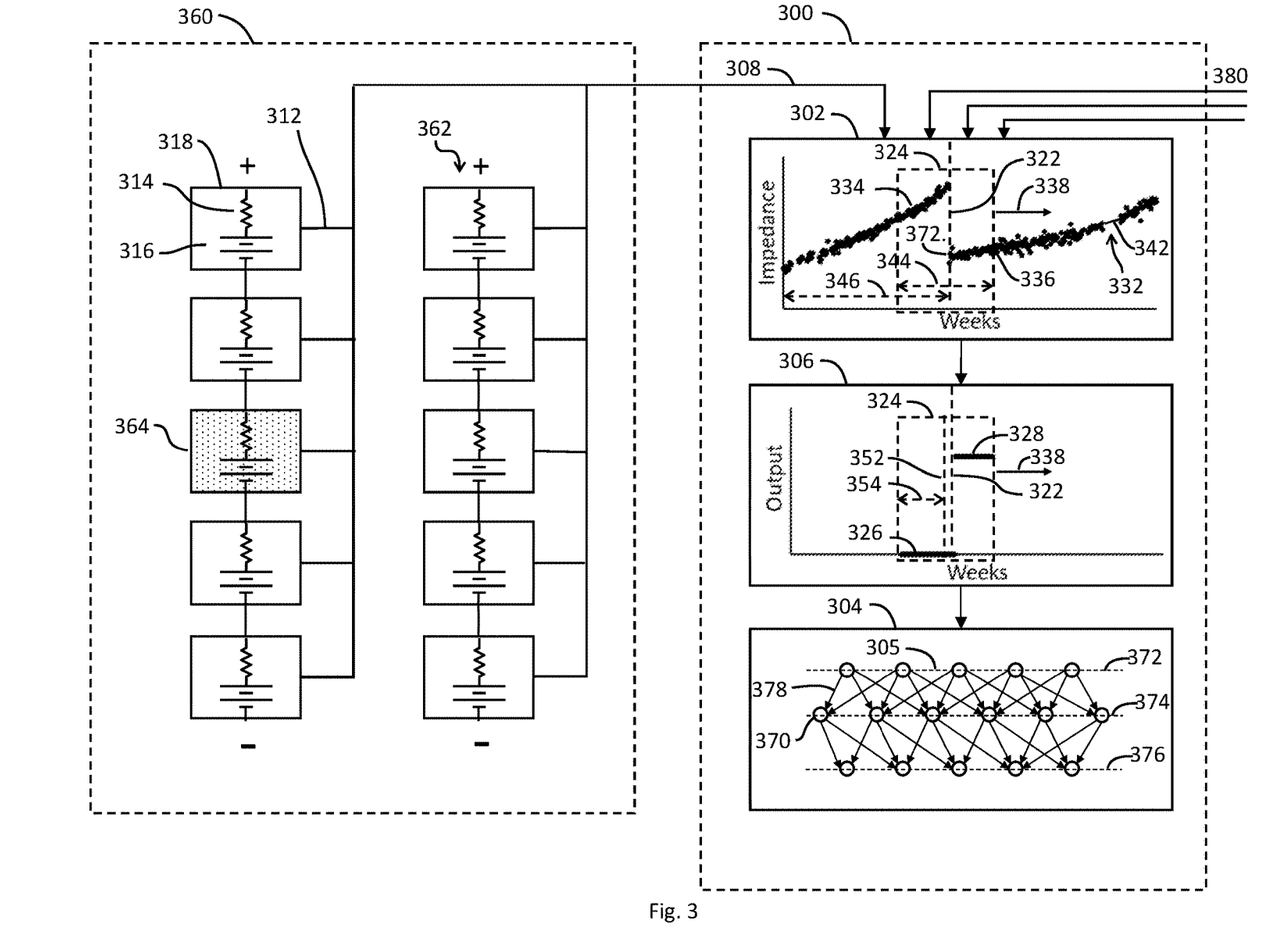
FIG. 3 is a schematic of a system for training a neural net to automatically determine when a battery changeout occurs.
Figure 4:
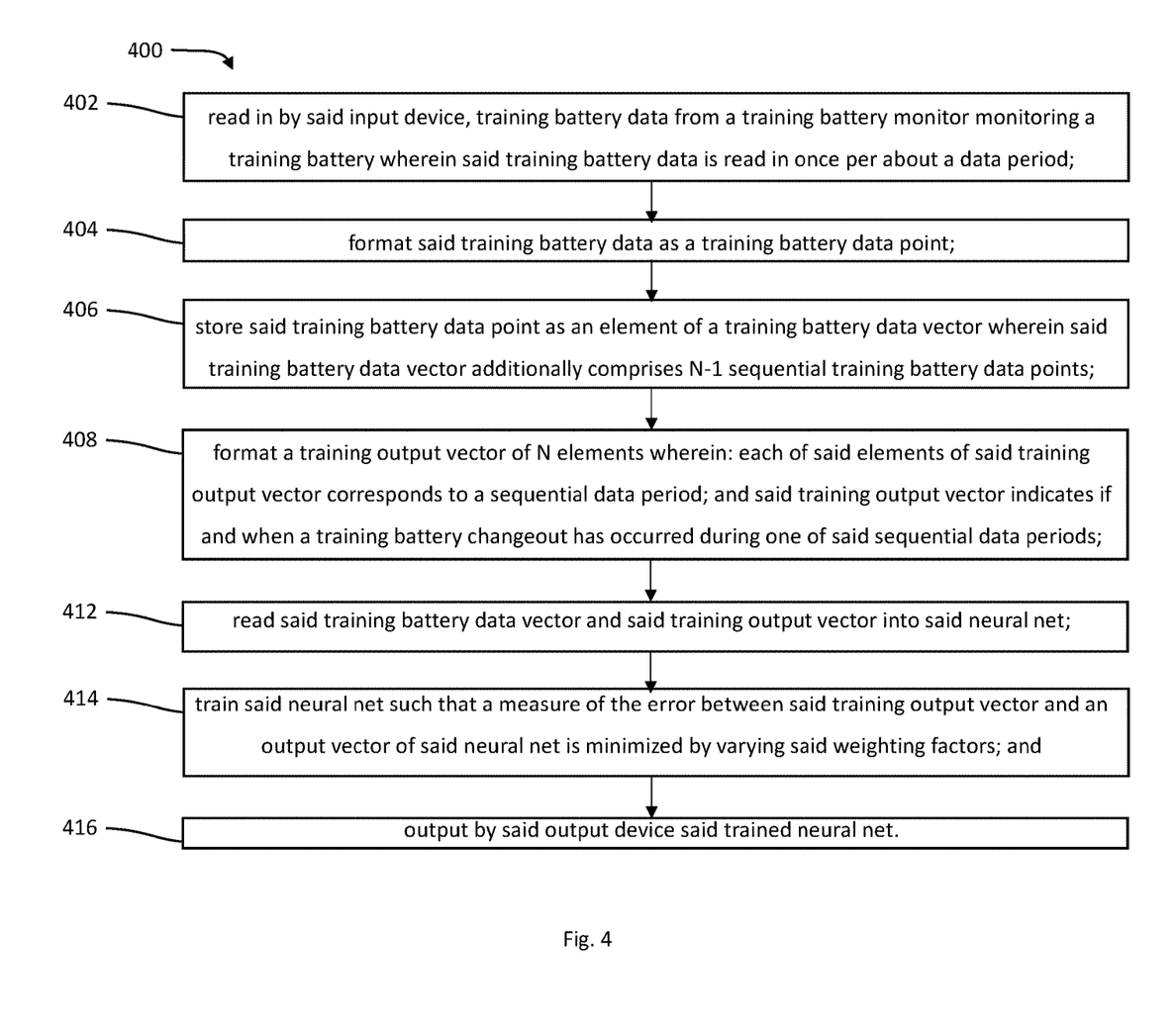
FIG. 4 is a flow chart of a method for training a neural net to automatically determine when a battery changeout occurs.
Figure 6:
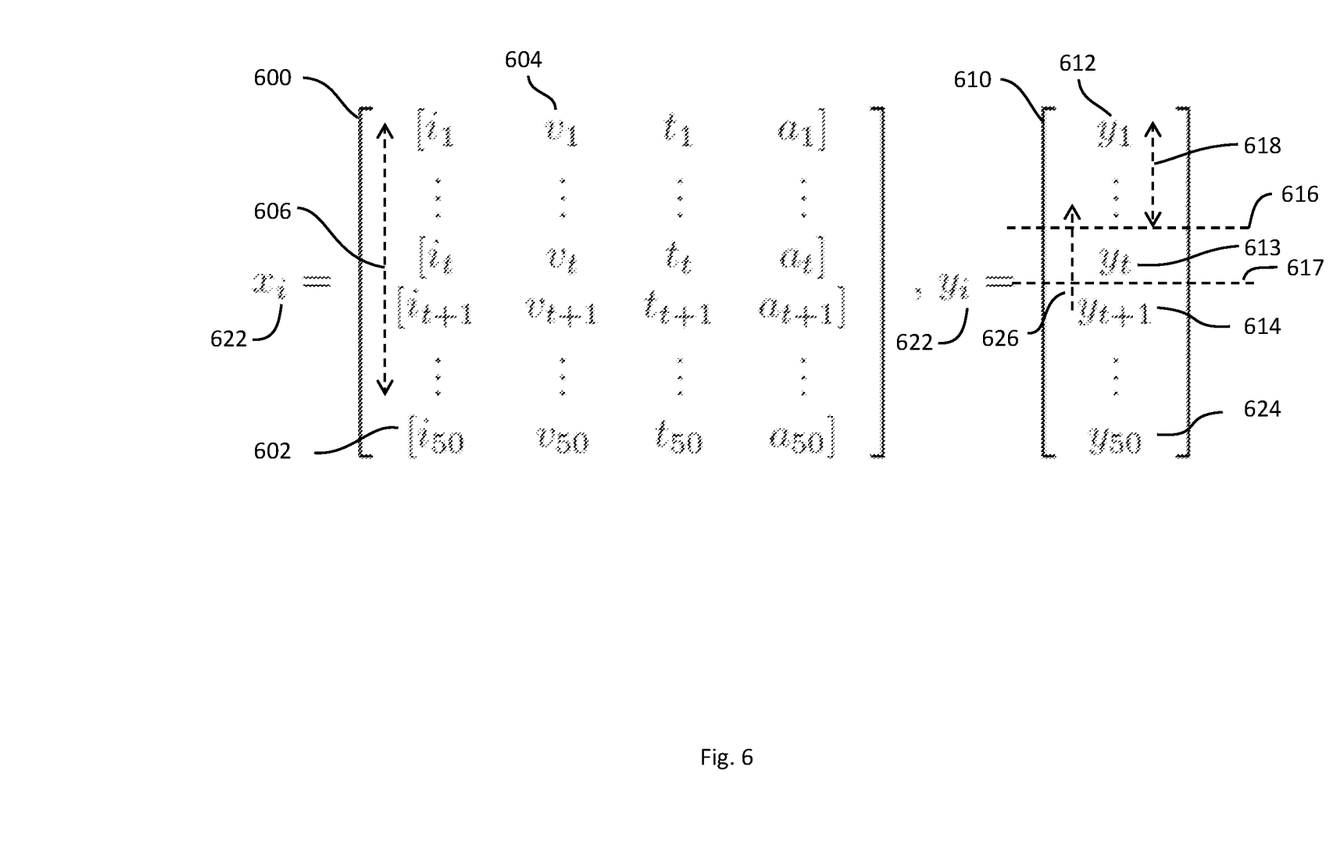
FIG. 6 is an illustration of a data structure format suitable for training a neural net to determine when a battery changeout occurs.

FIG. 3 is a schematic of a system for training a neural net to automatically determine when a battery changeout occurs. FIG. 4 is a flow chart of a method for training a neural net to automatically determine when a battery changeout occurs. FIG. 5 is a schematic of a neural net suitable for automatically determining when a battery changeout occurs. FIG. 6 is an illustration of a data structure format suitable for training a neural net to determine when a battery changeout occurs.

Referring collectively to FIGS. 3, 4, 5 and 6, a system 300 for training a neural net to automatically detect when a battery changeout occurs comprises:

a) an input device 302;
b) said neural net 305 comprising:
   i) one or more nodes 370; and
   ii) one or more weighting factors 378 associated with one or more inputs to each of said one or more nodes;
c) an output device 304;
d) a digital processor 306; and
e) a permanent memory comprising computer readable instructions to physically cause said digital processor to perform the steps 400:
   i) read in 308, 402 by said input device, training battery data 334, 604 from a training battery monitor 312 monitoring a training battery 318 wherein said training battery data is read in once per about a data period;
   ii) format 404 said training battery data as a training battery data point 602;
   iii) store 406 said training battery data point as an element of a training battery data vector 600 wherein said training battery data vector additionally comprises N−1 prior sequential training battery data points 606;
   iv) format 408 a training output vector 610 of N elements wherein:
      1. each of said elements 612 of said training output vector corresponds to a sequential data period; and
      2. said training output vector indicates 614 if and when a training battery changeout has occurred during one of said sequential data periods;
   v) read 412 said training battery data vector and said training output vector into said neural net;
   vi) train 414 said neural net such that a measure of the error between said training output vector and an output vector of said neural net is minimized by varying said weighting factors; and
   vii) output 416 by said output device 304 said trained neural net.

The training battery may have an expected life 346. N times the data period may be defined as a duration 344 for a training data window 324. The steps of training the neural net may include the step of setting the training data window duration to a value less than the expected life of the training battery. The values of N, data period and training data window duration used to train the neural net may be the same as the values of N, data period and data window duration used by the trained neural net in the system 100 for detecting battery changeout. A suitable value for the data period may be about a week. Any duration for the data period may be suitable depending upon the type of battery being monitored and its expected use. An expected life of a training battery may be 100 weeks or more. A suitable value for N is in the range of 50 to 350. Smaller and larger values may be suitable.

The chemistry and capacity of the training battery 318 may be the same or similar to the chemistry and capacity of the monitored battery 118 (FIG. 1). A neural net trained on one type of battery, however, may still be suitable for monitoring another type of battery when the behavior of the battery data due to a changeout is similar. For example, VRLA batteries often show a step change in impedance and/or voltage when a battery changeout occurs. Similar behavior is also seen with lithium batteries. Thus, a neural net trained on VRLA batteries may be suitable for detecting changeout in lithium batteries.

The steps for training the neural net may further comprise:
  a) when said training battery changeout 322, 617 occurs during said training data window 324, for each of said elements 612 of said training output vector 610:
    1) set a particular element (e.g. 613) of said training output vector to a first value 326 (e.g. 0) when said particular element occurs before said training battery changeout 322, 617; or
    2) set a particular element (e.g. 614) to a second value 328 (e.g. 1) when said particular element occurs on or after said training battery changeout 322, 617; or
  b) when no training battery changeout occurs during said training data window, set each value of said elements of said training output vector to said first value.

Cutoff

The training output vector may have a cutoff 352, 616 at M elements wherein M is less than N. A suitable value for M may be about 25 when N is about 50. The cutoff may be expressed as a cutoff duration 354 equal to M multiplied by the data period. When a cutoff is employed, the steps for training the neural net may comprise:
  i) identify one or more training battery changeouts 322 that occur during said training data window 324 and before said cutoff;
  ii) identify which of said one or more training battery changeouts occurs closest to said cutoff 352;
  iii) set all of said elements of said training output vector that occur before said closest training changeout to a first value 326;
  iv) set all of said elements of said training output vector that occur on or after said closest training changeout to a second value 328; or
  v) when no training battery changeouts are identified as occurring during said window and before said cutoff, set all of said elements of said training output vector to said first value.

Thus, the elements of the training output vector that occur after 618 the cutoff 616 will always be set to the first value. When two changeouts (e.g. 614, 624) occur in the same training data window before the cutoff, then all of the elements of the training output vector on or after the changeout (e.g. 614) closest to the cutoff will be set to the second value. When the closest changeout proceeds 626 past the cutoff due to the incrementing 338 of the training data window, only the elements on or after the second changeout (e.g. 624) will be set to the second value. All of the elements before the second changeout will be set to the first value.

Generating Training Data Vectors and Training Output Vectors

In order to generate multiple training data vectors and training output vectors, the training data window may be indexed 622 (e.g. increase parameter i by 1), or 338 (e.g. move the training data window one data period to the right) to successively later initial training data points 336. If gaps 332 are found in the training data, then intermediate values of the data may be extrapolated 342 from the data on each side of the gaps. All of the training data vectors and training output vectors generated in this manner can be used to train the neural net.

Neural Net Structure

The neural net may comprise an input layer 372, one or more hidden layers 374 and an output layer 376. Referring to FIG. 5, a suitable neural net 500 may comprise a bidirectional input layer 502, a first bidirectional LSTM layer 504, a second bidirectional LSTM layer 506 and a time distributed dense layer 508. The bidirectional LSTM layers are suitable for modeling time series data. The time distributed dense layer is suitable for generating an output vector with step changes.

The training battery data may comprise one or more of:
  a) a voltage 316 of said training battery;
  b) an impedance 314 of said training battery;
  c) an internal temperature of said training battery; or
  d) an ambient temperature of said training battery.

Identifying Scheduled Changeouts and Premature Failure Changeouts

Figure 7:
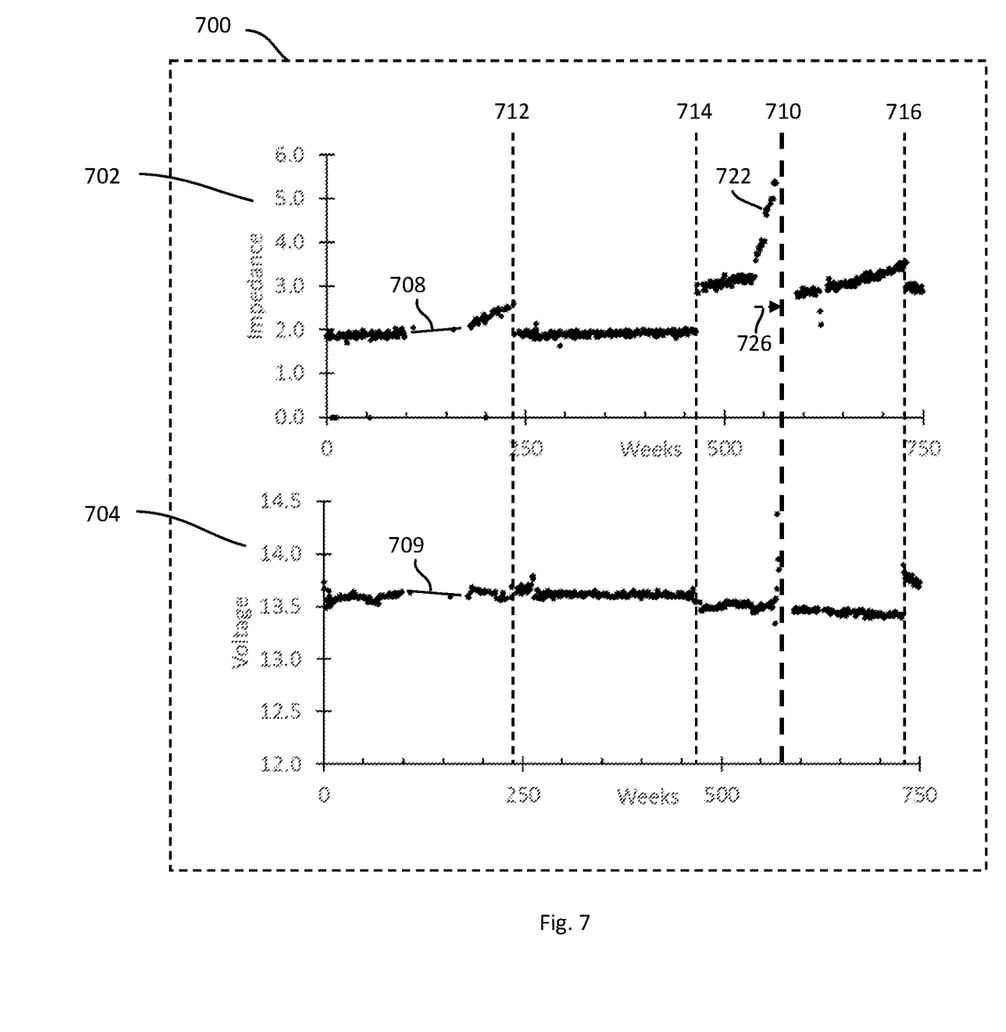
FIG. 7 is a set of graphs of training battery data suitable for training a neural net to distinguish between a scheduled changeout of a battery and a changeout due to premature failure of a battery.

FIG. 7 is a set of graphs 702, 704 displayed on a screen 700. The graphs show training battery data suitable for training a neural net to distinguish between a scheduled changeout of a battery 712, 714, 716 and a changeout 710 due to premature failure of a battery. The steps for training the neural net may comprise showing the training battery data in a graphical format on the screen 700 to a user. The first graph 702 is of training battery impedance 314 versus time (Weeks). The second graph 704 is of training battery voltage 316 versus time (Weeks). Extrapolated data 708, 709 is indicated during gaps in the measured data.

In some situations, data may not be available from the respective managers of the training battery facilities 360, 380 on when battery changeouts occurred. Thus, by displaying the data in graphical format on a screen, a user may nonetheless determine about when the changeouts occurred. The user would use judgement and a priori information on what the data looks like when battery changeouts occur (e.g. step changes). The changeouts determined by the user can then be used to train the neural net.

The fact that a user can determine from the data about when a changeout occurs indicates that unsupervised training may be used for an appropriately structured neural net to determine when changeouts occur without the need for the user to identify them. The appropriately structured neural net, for example, may learn to identify anomalous events (e.g. step changes) which can be later be defined as changeouts.

A user may be able to distinguish between a scheduled changeout and a changeout due to premature battery failure. A changeout due to premature battery failure may be preceded by a sudden rapid rise 722 in impedance followed by a step change in impedance as the failing training battery 364 is replaced. If there are multiple batteries in a string 362 or facility 360, then scheduled changeouts may be indicated by all batteries in the string showing step changes in one or more of impedance, voltage, the difference between the internal temperature of the battery and the ambient temperature, or other physical parameters that might be measured. Furthermore, the scheduled changeouts may be periodic and occur at roughly the expected lifetime of a battery or less. Thus, a user may identify and distinguish periodic changeouts from changeouts due to premature failure of a training battery. The corresponding data may then be used to train the neural net to make a similar distinction. The neural net may then identify characteristic changes in the battery data that precede a changeout due to premature battery failure and thus indicate an expected time 726 of a premature battery failure before it happens.

Example 1

A neural net programming code called Keras (https://keras.io/as of Oct. 17, 2019) was used to train a neural net to identify battery changeouts according to the processes described above. Keras is a high-level wrapper for TensorFlow (https://github.com/tensorflow/tensorflow as of Oct. 17, 2019) which is a set of machine learning utilities. The code used to design the neural network architecture was adapted from the website https://machinelearningmastery.com/ (as of Oct. 17, 2019). The training battery data included impedance, voltage, internal battery temperature, and ambient temperature. Not all variables were necessary to accurately classify battery changeout. A useful variable was impedance. Including the other variables, however, did yield good results.

Tests using a neural net 500 trained on approximately 700 batteries and tested on 70 showed an overall accuracy of 95%, with 2% false negatives and 10% false positives. A worst-case validation data set yielded 16% false negatives and 15% false positives for an overall accuracy of approximately 85%.

Alternative Modeling Techniques

Different machine learning techniques other than neural nets may be used to detect battery changeouts. One possible alternative technique is to fit a third-degree polynomial to the impedance value and calculate the derivative. If the derivative of the function turns negative, then it would suggest a changeout since a new battery typically exhibits lower initial impedance than the final values of the previous battery. Another possible alternative technique is to calculate a window of variance around the fitted function and apply a threshold to identify significant changes to impedance which may indicate battery changeout.

Advantages of neural networks relative to these alternative techniques include:
 less sensitivity to outliers that can skew the data; and
 better fitting of voltage and temperature than a polynomial.

Another alternative technique is polynomial curve fitting to the data. Neural networks, however, overcome some of the problems of polynomial curve fitting when applied to battery monitoring data. Often there are large spikes in the impedance measurement, or missing data altogether. Often these spikes happen somewhere in the first half of a battery's life. A model that accounts for variance over time would flag every instance of a data spike, and would require an arbitrary threshold be imposed on the number of weeks to ignore an outlier. These outliers then become part of the variance equation which dulls the model's ability to detect significant changes. On the other hand, when there is adequate history for the neural net to see, the neural net learns to ignore data spikes that occur too early in a battery's lifetime. Neural nets can do this without any special instruction. Neural nets can work with multivariate inputs better than polynomial fitting. In the case of battery monitoring, voltage is difficult to model with a polynomial. Neural nets can improve accuracy in some tasks when voltage is included as a feature.

Notwithstanding the above relative to neural nets, the alternative techniques can produce useful results.

Conclusion

While the disclosure has been described with reference to one or more different exemplary embodiments, it will be understood by those skilled in the art that various changes may be made and equivalents may be substituted for elements thereof without departing from the scope of the disclosure. In addition, many modifications may be made to adapt to a particular situation without departing from the essential scope or teachings thereof. Therefore, it is intended that the disclosure not be limited to the particular embodiment disclosed as the best mode contemplated for carrying out this invention.

I claim:

1. A system for automatically detecting when a battery changeout occurs, said system comprising:
 a) an input device;
 b) a neural net trained to identify when said battery changeout occurs based on data from a battery monitor and to distinguish between a changeout due to a premature failure of said battery or a scheduled changeout of said battery;
 c) an output device;
 d) a digital processor; and
 e) a permanent memory comprising computer readable instructions to physically cause said digital processor to perform the steps:
  i) read in by said input device, battery data from said battery monitor monitoring a battery wherein said battery data is read in once per about a data period;
  ii) format said battery data as a battery data point;
  iii) store said battery data point as an element of a battery data vector of N elements wherein said battery data vector additionally comprises N-1 prior sequential battery data points, and wherein said battery data vector includes at least one battery data point corresponding to a time before said battery changeout has occurred and at least one battery data point corresponding to a time after said battery changeout has occurred;
  iv) read said battery data vector into said neural net;
  v) format by said neural net, an output vector of N elements wherein said output vector indicates when said battery changeout has occurred; and
  vi) output by said output device said indication of when said battery changeout has occurred and an indication of a changeout cause corresponding to one of said changeout due to a premature failure or said scheduled changeout.

2. The system of claim 1 wherein:
 a) said battery has an expected life;
 b) N multiplied by said data period defines a data window duration; and
 c) said steps comprise the step of setting said data window duration to a value less than said expected life of said battery.

3. The system of claim 2 wherein:
 a) said data period is about a week;

b) said expected life of said battery is more than 100 weeks; and
c) N is about 50.

4. The system of claim 2 wherein:
a) said neural net has been trained by a supervised process using training data that comprises:
   i) data from a training battery monitor monitoring a training battery; and
   ii) an indication of when a training changeout occurred for said training battery;
b) said training data from said training battery has been read at least once per about said data period;
c) said training data comprises one or more training output vectors of N elements each occurring during a training data window; and
d) when a training changeout occurs during a training data window, each of said elements of said training output vector has a first value when an element occurs before said training changeout or a second value when an element occurs on or after said training changeout.

5. The system of claim 4 wherein said steps further comprise:
a) determine when said changeout has occurred based on when said elements of said output vector from said neural net change from said first value to said second value; and
b) output by said output device said determination.

6. The system of claim 1 wherein each of said battery data points comprises values of one or more of:
a) a voltage of said battery;
b) an impedance of said battery;
c) an internal temperature of said battery; or
d) an ambient temperature of said battery.

7. The system of claim 1 wherein said steps further comprise:
a) when no battery data is available from said battery monitor, extrapolate said battery data forecast based at least in part on a prior value of said battery data.

8. The system of claim 1 which further comprises said battery monitor.

9. The system of claim 1 wherein:
a) said neural net has been further trained to forecast when a battery is expected to fail prematurely; and
b) said steps further comprise the steps of outputting by said output device, an indication of about when said premature failure is expected to occur.

10. A system for training a neural net to automatically detect when a battery changeout occurs, said system comprising:
a) an input device;
b) said neural net comprising:
   i) one or more nodes; and
   ii) one or more weighting factors associated with one or more inputs to each of said one or more nodes;
c) an output device;
d) a digital processor; and
e) a permanent memory comprising computer readable instructions to physically cause said digital processor to perform the steps:
   i) read in by said input device, training battery data from a training battery monitor monitoring a training battery wherein said training battery data is read in once per about a data period;
   ii) format said training battery data as a training battery data point;
   iii) store said training battery data point as an element of a training battery data vector wherein said training battery data vector additionally comprises N−1 prior sequential training battery data points, and wherein said training battery data vector includes at least one training battery data point corresponding to a time before said training battery changeout has occurred and at least one training battery data point corresponding to a time after said training battery changeout has occurred;
   iv) format a training output vector of N elements wherein:
      1. Each of said elements of said training output vector corresponds to a sequential data period; and
      2. said training output vector indicates if and when a training battery changeout has occurred during one of said sequential data periods and includes an indication of whether or not said training battery changeout was due to a premature failure of said training battery or a scheduled changeout of said training battery;
   v) train said neural net to distinguish between a training changeout due to a premature failure of said training battery or a scheduled changeout of said training battery;
   vi) read said training battery data vector and said training output vector into said neural net;
   vii) train said neural net such that a measure of the error between said training output vector and an output vector of said neural net is minimized by varying said weighting factors; and
   viii) output by said output device said trained neural net.

11. The system of claim 10 wherein:
a) said training battery has an expected life;
b) N times said data period defines a training data window duration; and
c) said steps comprise the step of setting said training data window duration to a value less than said expected life of said training battery.

12. The system of claim 11 wherein:
a) said data period is about a week;
b) said expected life of said training battery is more than 100 weeks; and
c) N is about 50.

13. The system of claim 11 wherein said steps comprise:
a) when said training battery changeout occurs during said training data window, for each of said elements of said training output vector:
   1) Set a particular element of said training output vector to a first value when said particular element occurs before said training battery changeout; or
   2) Set a particular element to a second value when said particular element occurs on or after said training battery changeout; or
b) when no training battery changeout occurs during said training data window, set each value of said elements of said training output vector to said first value.

14. The system of claim 11 wherein:
a) said training output vector has a cutoff at M elements wherein M is less than N; and
b) said steps comprise:
   i) identify one or more training battery changeouts that occur during said training data window and before said cutoff;
   ii) identify which of said one or more training battery changeouts occurs closest to said cutoff;

iii) set all of said elements of said training output vector that occur before said closest training changeout to a first value;
iv) set all of said elements of said training output vector that occur on or after said closest training changeout to a second value; or
v) when no training battery changeouts are identified as occurring during said training data window and before said cutoff, set all of said elements of said training output vector to said first value.

15. The system of claim 10 wherein:
a) said neural net comprises:
  i) an input layer;
  ii) one or more hidden layers; and
  iii) an output layer; and
b) said one or more hidden layers comprises a bidirectional long short-term memory layer.

16. The system of claim 10 wherein each of said training battery data points comprises values of one or more of:
a) a voltage of said training battery;
b) an impedance of said training battery;
c) an internal temperature of said training battery; or
d) an ambient temperature of said training battery.

17. The system of claim 1 wherein:
said steps further comprise the step of, when said battery changeout is detected, identify an initial physical property of a new battery.

18. The system of claim 17 wherein:
said steps further comprise the step of, determine a future state of health of said new battery corresponding to said initial physical property.

* * * * *